A multi-bit resistive random access memory cell includes a plurality of bottom electrodes, a plurality of dielectric layers, a top electrode and a resistance layer. The bottom electrodes and the dielectric layers are interleaved layers, each of the bottom electrodes is sandwiched by the dielectric layers, and a through hole penetrates through the interleaved layers. The top electrode is disposed in the through hole. The resistance layer is disposed on a sidewall of the through hole and is between the top electrode and the interleaved layers, thereby the top electrode, the resistance layer and the bottom electrodes constituting a multi-bit resistive random access memory cell. The present invention also provides a method of forming the multi-bit resistive random access memory cell.

11 Claims, 6 Drawing Sheets

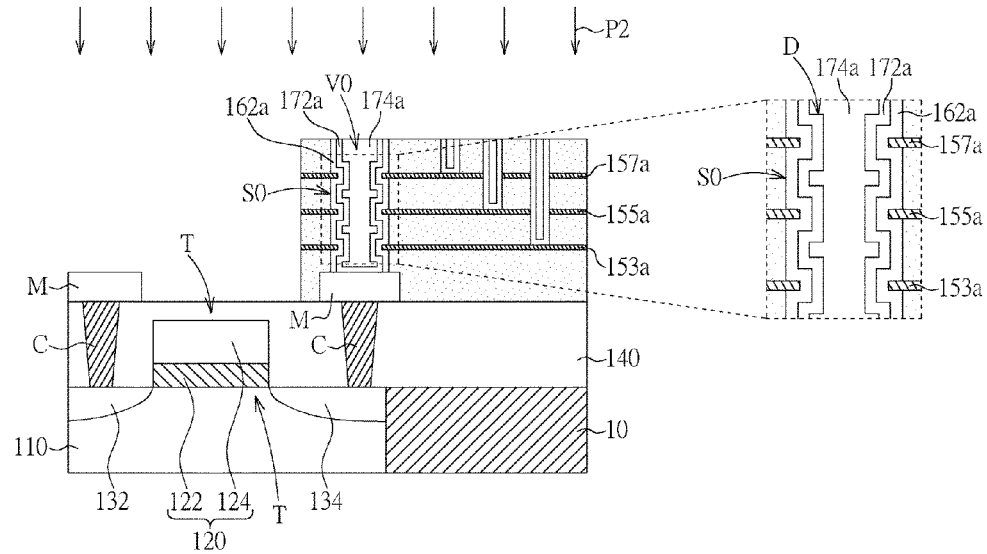

(56) References Cited

U.S. PATENT DOCUMENTS

| | | | |
|---|---|---|---|
| 2015/0200359 A1* | 7/2015 | Xu | H01L 45/1226 |
| | | | 257/4 |
| 2016/0351623 A1* | 12/2016 | Chen | H01L 45/1233 |
| 2017/0047516 A1* | 2/2017 | Cho | H01L 45/1683 |
| 2019/0088318 A1 | 3/2019 | Morooka | |
| 2019/0140171 A1* | 5/2019 | BrightSky | H01L 45/1246 |

* cited by examiner

MULTI-BIT RESISTIVE RANDOM ACCESS MEMORY CELL AND FORMING METHOD THEREOF

BACKGROUND OF THE INVENTION

1. Field of the Invention

The present invention relates generally to a resistive random access memory cell and forming method thereof, and more specifically to a multi-bit resistive random access memory cell and forming method thereof.

2. Description of the Prior Art

Memory is divided into two categories: volatile memory and non-volatile memory. In nowadays, the two important types of volatile memory are static random access memory (SRAM) and dynamic random access memory (DRAM). There are many types of non-volatile memory. Flash memory is the most popular type, and other types may include silicon-oxide-nitride-oxide-silicon (SONOS), ferroelectric random access memory (FRAM), phase-change random access memory (PRAM), magnetoresistive access memory (MRAM) and resistive random access memory (RRAM).

In semiconductor processes, a resistive random-access memory is composed of two upper and lower metal electrodes and a transition metal oxide (TMO). The operating theory is to use the variable resistance of the transition metal oxide. The applied bias voltage changes to induce different resistance values, and the internal stored value is determined by the internal resistance.

SUMMARY OF THE INVENTION

The present invention provides a multi-bit resistive random access memory cell and forming method thereof, which forms a multi-bit resistive random access memory cell by interleaved layers of bottom electrodes and dielectric layers. Thus, this multi-bit resistive random access memory cell has vertically distributed bits to save space and simplify processes.

The present invention provides a multi-bit resistive random access memory cell including a plurality of bottom electrodes, a plurality of dielectric layers, a top electrode and a resistance layer. The bottom electrodes and the dielectric layers are interleaved layers, each of the bottom electrodes is sandwiched by the dielectric layers, and a through hole penetrates through the interleaved layers. The top electrode is disposed in the through hole. The resistance layer is disposed on a sidewall of the through hole and is between the top electrode and the interleaved layers, thereby the top electrode, the resistance layer and the bottom electrodes constituting a multi-bit resistive random access memory cell.

The present invention provides a method of forming a multi-bit resistive random access memory cell including the following steps. A first dielectric layer, a first bottom electrode, a second dielectric layer, a second bottom electrode, a third dielectric layer, a third bottom electrode and a fourth dielectric layer are sequentially formed on a layer. A first etching process is performed to pattern the fourth dielectric layer, the third bottom electrode, the third dielectric layer, the second bottom electrode, the second dielectric layer, the first bottom electrode and the first dielectric layer to form a through hole in the first dielectric layer, the first bottom electrode, the second dielectric layer, the second bottom electrode, the third dielectric layer, the third bottom electrode and the fourth dielectric layer. A resistance layer is formed to conformally cover a sidewall of the through hole and a top electrode fills in the through hole, thereby the multi-bit resistive random access memory cell being formed.

According to the above, the present invention provides a multi-bit resistive random access memory cell and forming method thereof, which sequentially forms a first dielectric layer, a first bottom electrode, a second dielectric layer, a second bottom electrode, a third dielectric layer, a third bottom electrode and a fourth dielectric layer on a layer; performs a first etching process to pattern the fourth dielectric layer, the third bottom electrode, the third dielectric layer, the second bottom electrode, the second dielectric layer, the first bottom electrode and the first dielectric layer to form a through hole in the first dielectric layer, the first bottom electrode, the second dielectric layer, the second bottom electrode, the third dielectric layer, the third bottom electrode and the fourth dielectric layer; and forms a resistance layer conformally covering a sidewall of the through hole and fills a top electrode in the through hole. Thereby, a multi-bit resistive random access memory cell is carried out.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
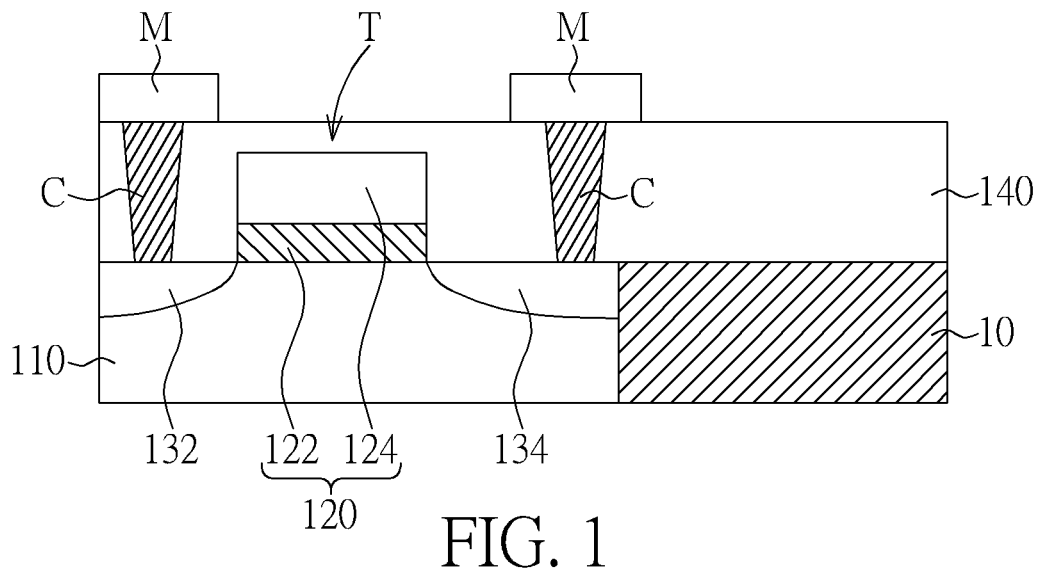
FIG. 1 schematically depicts a cross-sectional view of a method of forming a multi-bit resistive random access memory cell according to an embodiment of the present invention.
Figure 2:
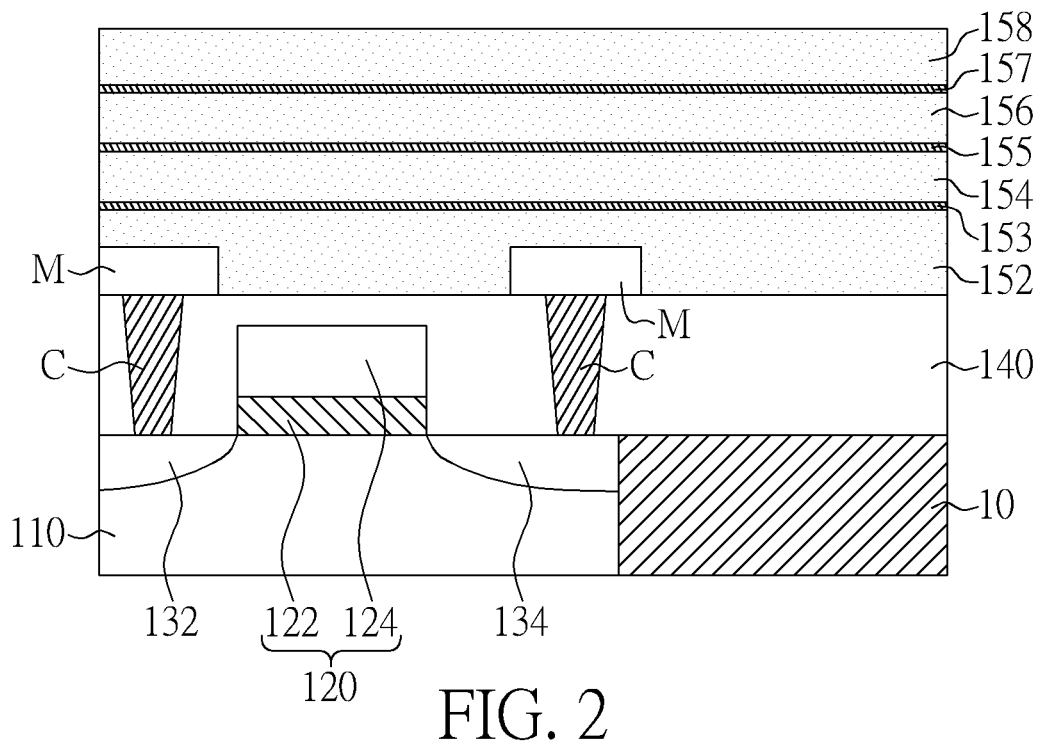
FIG. 2 schematically depicts a cross-sectional view of a method of forming a multi-bit resistive random access memory cell according to an embodiment of the present invention.

FIGS. 1-9 schematically depict cross-sectional views of a method of forming a multi-bit resistive random access memory cell according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A resistive random access memory area is only depicted in this embodiment, and resistive random access memory cells are in the resistive random access memory area. Furthermore, the substrate 110 may also include other not depicted areas such as logic areas and alignment mark areas etc. An isolation structure 10 is formed in the substrate 110 to electrically isolate each transistor from each other. The isolation structure 10 may be a shallow trench isolation (STI) structure, which may be formed by a shallow trench isolation (STI) process, but it is not limited thereto.

A gate 120 is formed on the substrate 110. The gate 120 may include a gate dielectric layer 122 and a gate electrode 124 stacked from bottom to top. The gate dielectric layer 122 may be an oxide layer or a dielectric layer having a high dielectric constant. The dielectric layer having a high dielectric constant may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST); the gate electrode 124 may be a polysilicon gate or a metal gate, but it is not limited thereto. A source 132 and a drain 134 are formed in the substrate 110 beside the gate 120. Thereby, a transistor T is formed.

An interlayer dielectric layer 140 formed by depositing and then planarizing blanketly covers the gate 120 and the substrate 110. Contact plugs C are formed in the interlayer dielectric layer 140 and directly contact the source 132 and the drain 134. A metal interconnect M is formed on the contact plugs C.

A first dielectric layer 152, a first bottom electrode 153, a second dielectric layer 154, a second bottom electrode 155, a third dielectric layer 156, a third bottom electrode 157 and a fourth dielectric layer 158 are sequentially formed on the interlayer dielectric layer 140. In this embodiment, these layers are formed on the interlayer dielectric layer 140 form forming a multi-bit resistive random access memory cell. In other embodiments, these layers may be formed on other layers.

A first etching process P1 is performed to pattern the fourth dielectric layer 158, the third bottom electrode 157, the third dielectric layer 156, the second bottom electrode 155, the second dielectric layer 154, the first bottom electrode 153 and the first dielectric layer 152, thereby a through hole V being formed in the first dielectric layer 152, the first bottom electrode 153, the second dielectric layer 154, the second bottom electrode 155, the third dielectric layer 156, the third bottom electrode 157 and the fourth dielectric layer 158, and the through hole V exposing the metal interconnect M. The first etching process P1 may be a dry etching process, but it is not limited thereto.

Figure 4:
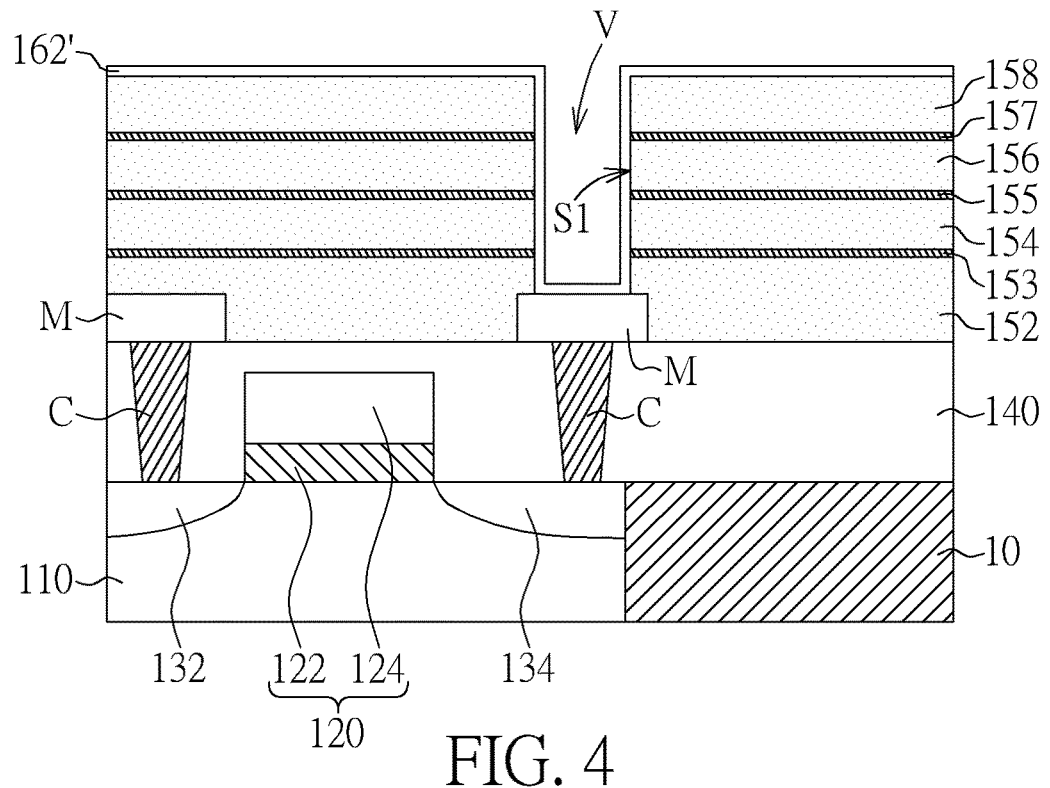
FIG. 4 schematically depicts a cross-sectional view of a method of forming a multi-bit resistive random access memory cell according to an embodiment of the present invention.
Figure 5:
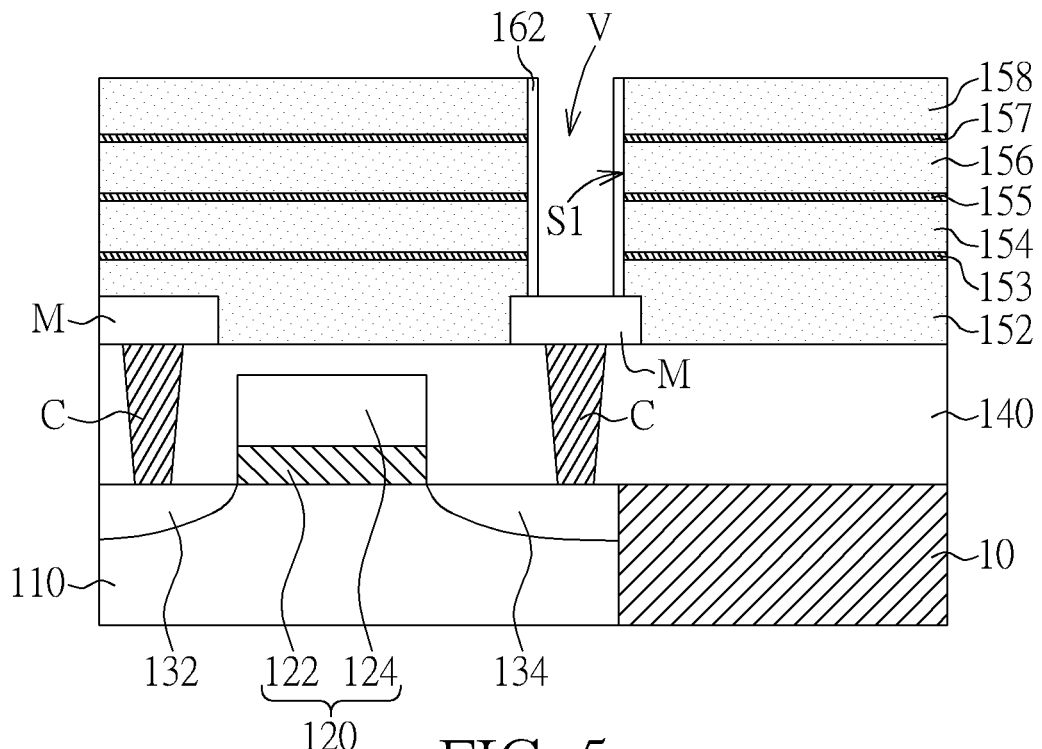
FIG. 5 schematically depicts a cross-sectional view of a method of forming a multi-bit resistive random access memory cell according to an embodiment of the present invention.

Please refer to FIGS. 4-5, a resistance layer 162 is formed to conformally cover a sidewall S1 of the through hole V. As shown in FIG. 4, a resistance material layer 162' is deposited to conformally cover a bottom and the sidewall S1 of the through hole V and the fourth dielectric layer 158. Then, a part of the resistance material layer 162' exceeding from the through hole V is removed, to form the resistance layer 162, as shown in FIG. 5.

Figure 6:
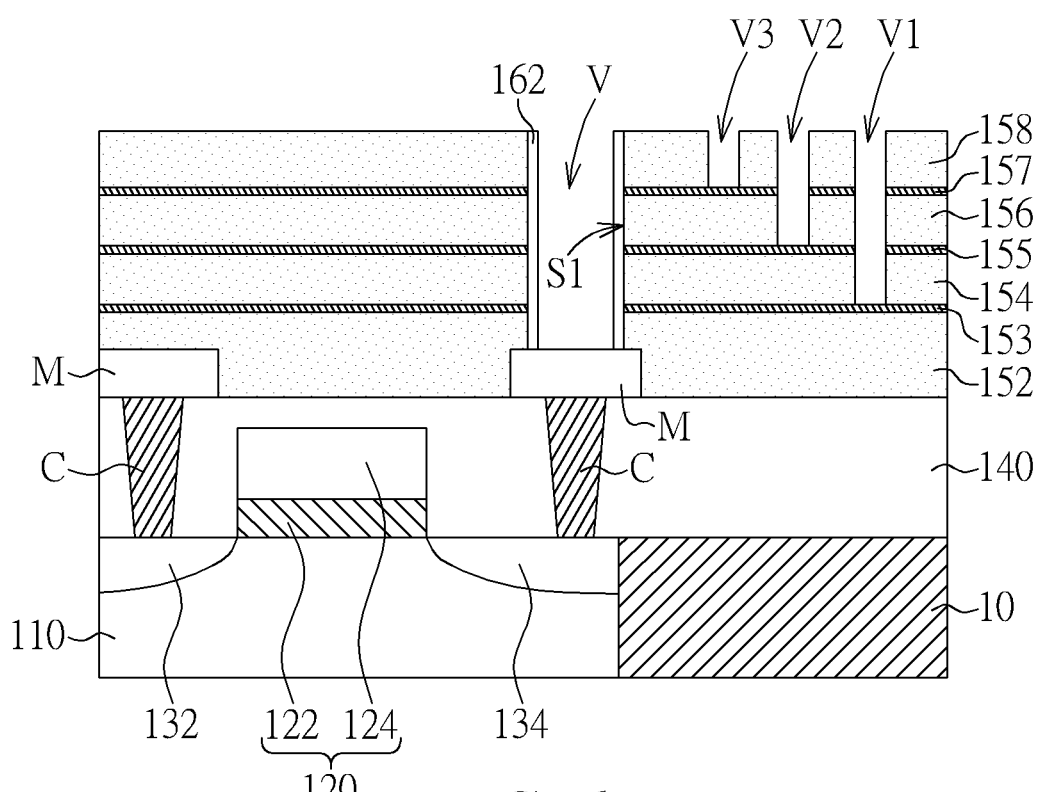
FIG. 6 schematically depicts a cross-sectional view of a method of forming a multi-bit resistive random access memory cell according to an embodiment of the present invention.

Thereafter, the fourth dielectric layer 158, the third bottom electrode 157, the third dielectric layer 156, the second bottom electrode 155, the second dielectric layer 154 are patterned to form a first contact hole V1, a second contact hole V2 and a third contact hole V3, as shown in FIG. 6.

Figure 7:
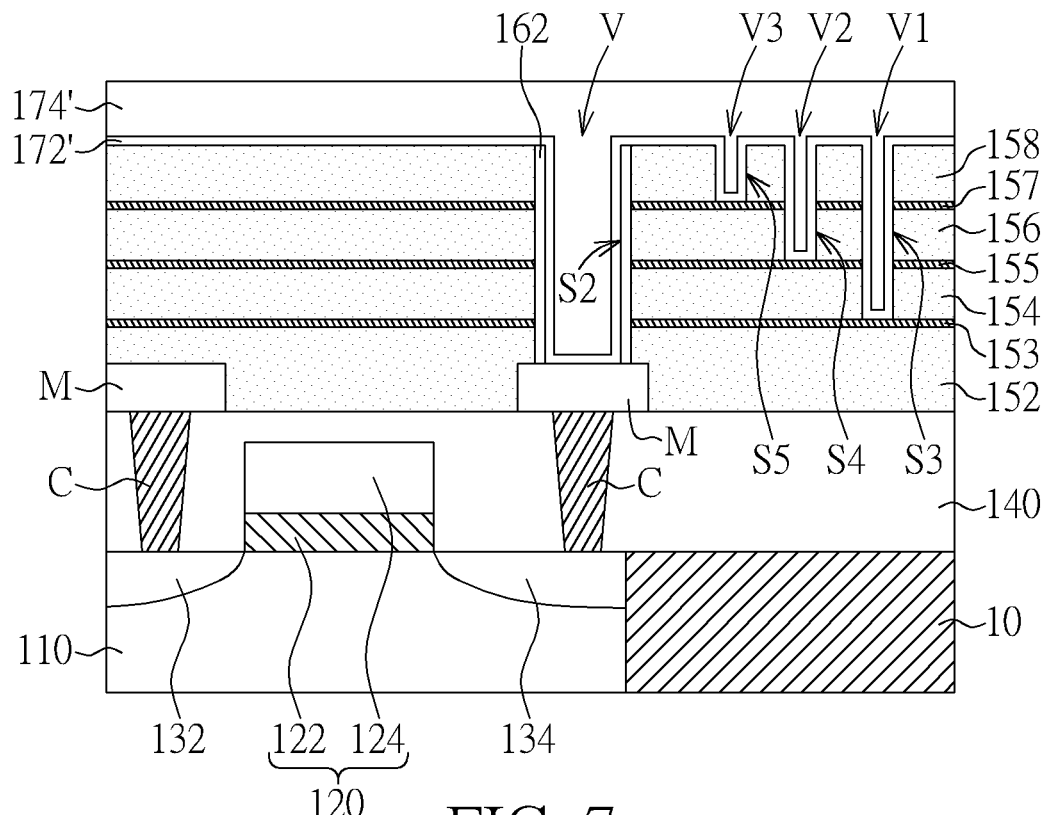
FIG. 7 schematically depicts a cross-sectional view of a method of forming a multi-bit resistive random access memory cell according to an embodiment of the present invention.

As show in FIG. 7, a barrier layer 172' may be formed to conformally cover a bottom of the through hole V, a sidewall S2 of the resistance layer 162, a bottom and a sidewall S3 of the first contact hole V1, a bottom and a sidewall S4 of the second contact hole V2, a bottom and a sidewall S5 of the third contact hole V3 and the fourth dielectric layer 158. A top electrode material 174' fills up the through hole V, the first contact hole V1, the second contact hole V2, the third contact hole V3 and covers the fourth dielectric layer 158.

Figure 8:
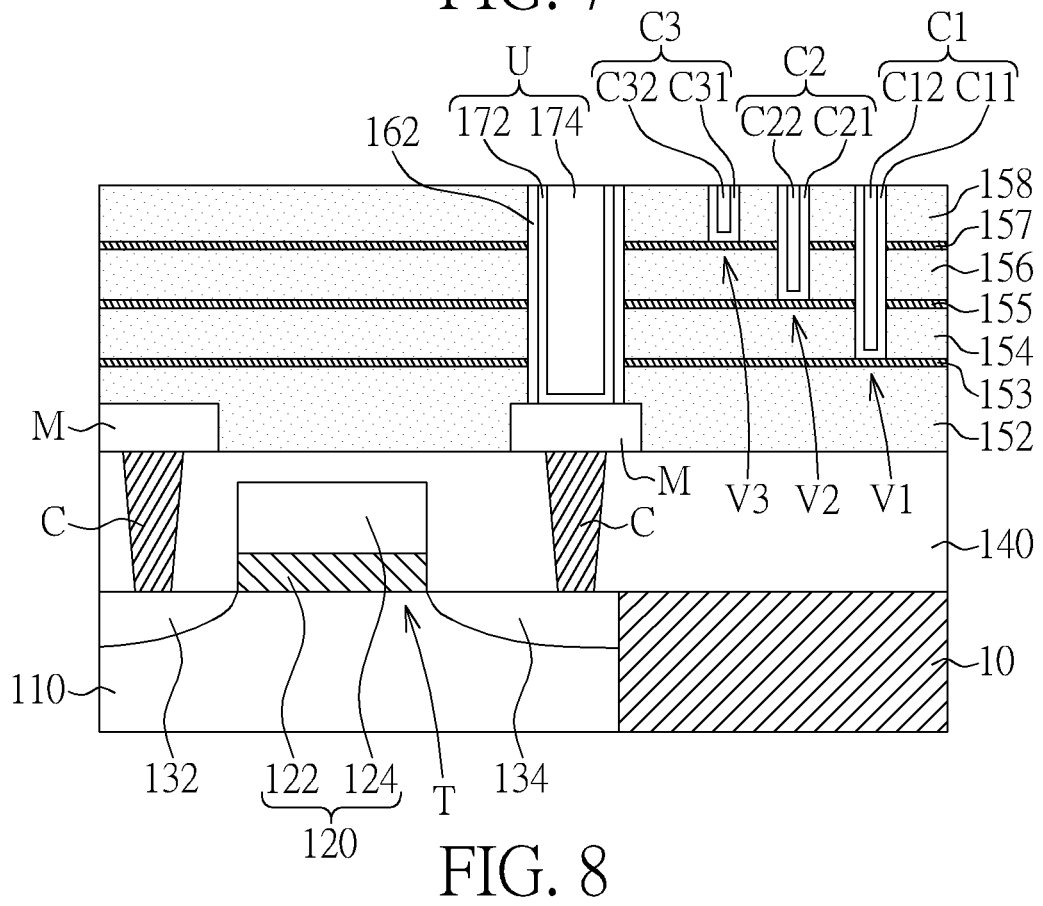
FIG. 8 schematically depicts a cross-sectional view of a method of forming a multi-bit resistive random access memory cell according to an embodiment of the present invention.

Then, a part of the top electrode material 174' and a part of the barrier layer 172' exceeding from the through hole V, the first contact hole V1, the second contact hole V2 and the third contact hole V3 are removed to form a multi-bit resistive random access memory cell U in the through hole V, a first contact via C1 in the first contact hole V1, a second contact via C2 in the second contact hole V2 and a third contact via C3 in the third contact hole V3, as shown in FIG. 8. The multi-bit resistive random access memory cell U is electrically connected to the drain 134 of the transistor T. The multi-bit resistive random access memory cell U includes a barrier layer 172 surrounding a top electrode 174. The first contact via C1 includes a barrier layer C11 surrounding a top electrode material C12. The second contact via C2 includes a barrier layer C21 surrounding a top electrode material C22. The third contact via C3 includes a barrier layer C31 surrounding a top electrode material C32.

The first contact via C1 is disposed in the first contact hole V1, penetrates through the second dielectric layer 154, the second bottom electrode 155, the third dielectric layer 156, the third bottom electrode 157 and the fourth dielectric layer 158, and directly contacts and is electrically connected to the first bottom electrode 153. The second contact via C2 is disposed in the second contact hole V2, penetrates through the third dielectric layer 156, the third bottom electrode 157 and the fourth dielectric layer 158, and directly contacts and is electrically connected to the second bottom electrode 155. The third contact via C3 is disposed in the third contact hole V3, penetrates through the fourth dielectric layer 158, and directly contacts and is electrically connected to the third bottom electrode 157.

Figure 9:
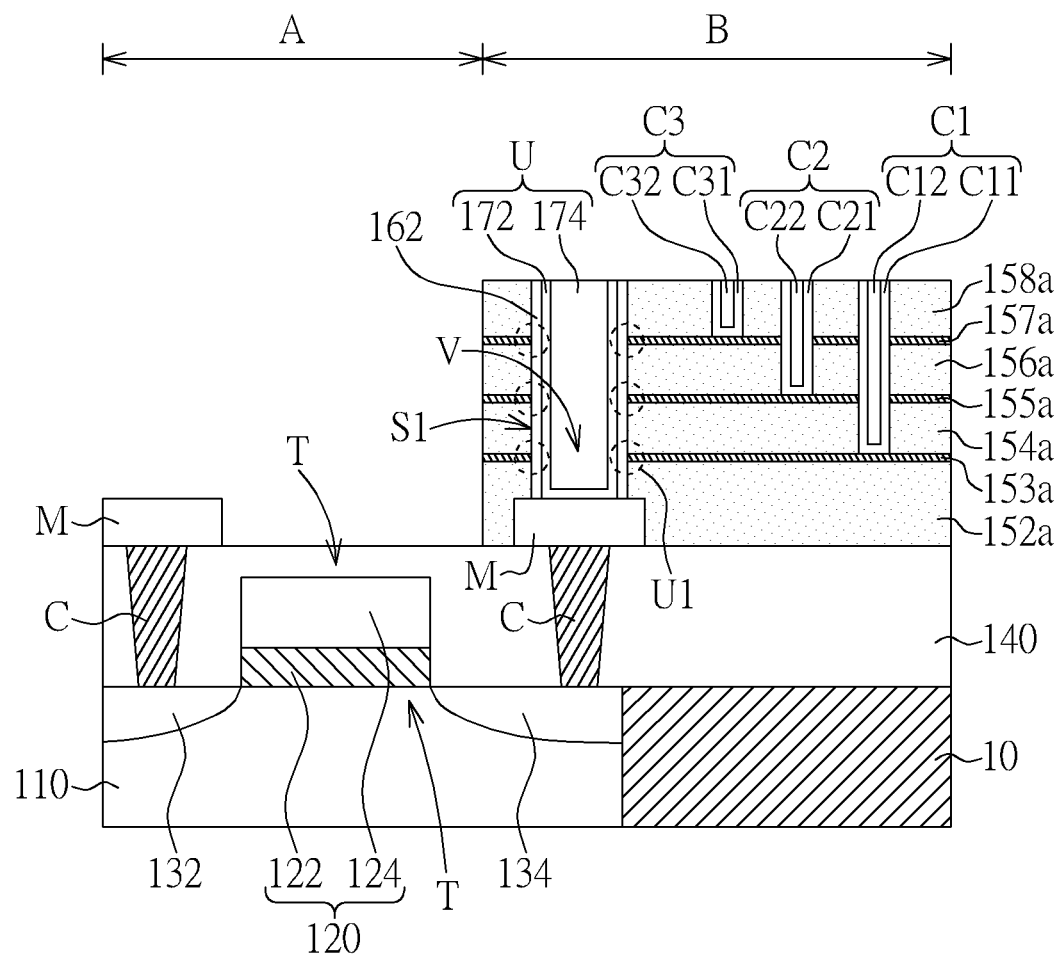
FIG. 9 schematically depicts a cross-sectional view of a method of forming a multi-bit resistive random access memory cell according to an embodiment of the present invention.

The fourth dielectric layer 158, the third bottom electrode 157, the third dielectric layer 156, the second bottom electrode 155, the second dielectric layer 154, the first bottom electrode 153 and the first dielectric layer 152 may be selectively patterned to expose a first area A but preserve the first dielectric layer 152, the first bottom electrode 153, the second dielectric layer 154, the second bottom electrode 155, the third dielectric layer 156, the third bottom electrode 157 and the fourth dielectric layer 158 in a second area B, therefore a first dielectric layer 152a, a first bottom electrode 153a, a second dielectric layer 154a, a second bottom electrode 155a, a third dielectric layer 156a, a third bottom electrode 157a and a fourth dielectric layer 158a being formed on the interlayer dielectric layer 140, as shown in FIG. 9. Components may thus be disposed on the interlayer dielectric layer 140 of the first area A.

Above all, the barrier layer 172' of FIG. 7 is formed in the through hole V, the first contact hole V1, the second contact hole V2 and the third contact hole V3 at the same time. The top electrode material 174' of FIG. 7 is formed in the through hole V, the first contact hole V1, the second contact hole V2 and the third contact hole V3 at the same time. In other cases, the multi-bit resistive random access memory cell U, the first contact via C1, the second contact via C2 and the third contact via C3 may be formed respectively.

As shown in FIG. 9, the multi-bit resistive random access memory cell U is carried out. The multi-bit resistive random access memory cell U may include a plurality of bottom electrodes (meaning the first bottom electrode 153a, the second bottom electrode 155a and the third bottom electrode 157a in this embodiment) and a plurality of dielectric layers (meaning the first dielectric layer 152a, the second dielectric layer 154a, the third dielectric layer 156a and the fourth dielectric layer 158a in this embodiment), but the number of the bottom electrodes and the dielectric layers is not restricted thereto. The bottom electrodes (meaning the first bottom electrode 153a, the second bottom electrode 155a and the third bottom electrode 157a in this embodiment) and the dielectric layers (meaning the first dielectric layer 152a, the second dielectric layer 154a, the third dielectric layer 156a and the fourth dielectric layer 158a in this embodiment) constitute interleaved layers, wherein each of the bottom electrodes is sandwiched by the dielectric layers, and the through hole V penetrates through the interleaved layers. The top electrode 174 is disposed in the through hole V. The resistance layer 162 is disposed on the sidewall S1 of the through hole V and is between the top electrode 174 and the interleaved layers, thereby the top electrode 174, the resistance layer 162 and the bottom electrodes 153a/155a/157a constituting the multi-bit resistive random access memory cell U.

The contact vias (meaning the first contact via C1, the second contact via C2 and the third contact via C3 in this embodiment) are disposed in the dielectric layers 152a/154a/156a/158a. The bottom electrodes 153a/155a/157a are connected to a plurality of contact vias C1/C2/C3, wherein each of the bottom electrodes 153a/155a/157a is connected to a corresponding contact vias C1/C2/C3, and the contact vias C1/C2/C3 are isolated from each other. The bottom electrodes 153a/155a/157a serve as word lines while the top electrode 174 serves as a bit line, thereby parts of the resistance layer 162 respectively connecting the bottom electrodes 153a/155a/157a and the top electrode 174 constituting bits U1 of the multi-bit resistive random access memory cell U. The multi-bit resistive random access memory cell U have vertically distributed bits U1 to save space and simplify processes. The bottom electrodes 153a/155a/157a may include titanium nitride (TiN) or tantalum nitride (TaN), and the top electrode 174 may include copper. The resistance layer 162 may include transition metal oxide, wherein the resistance layer 162 may include tantalum oxide ($TaO_x$), titanium oxide ($TiO_x$), hafnium oxide ($HfO_x$), zirconium oxide ($ZrO_x$) or aluminum oxide ($AlO_x$), but it is not limited thereto.

Figure 10:
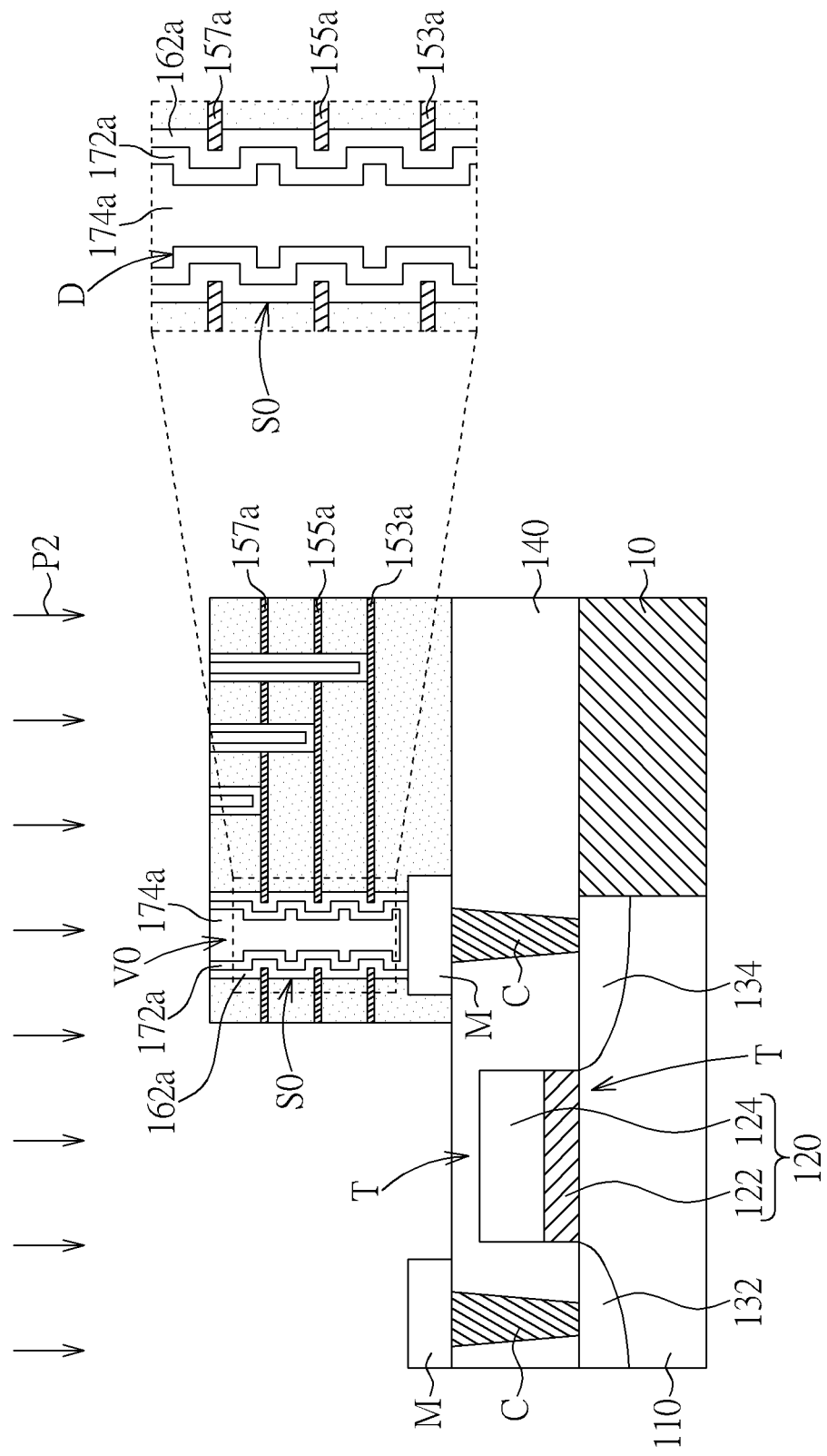
FIG. 10 schematically depicts a cross-sectional view of a method of forming a multi-bit resistive random access memory cell according to another embodiment of the present invention.

One embodiment is further presented as follows. FIG. 10 schematically depicts a cross-sectional view of a method of forming a multi-bit resistive random access memory cell according to another embodiment of the present invention.

Figure 3:
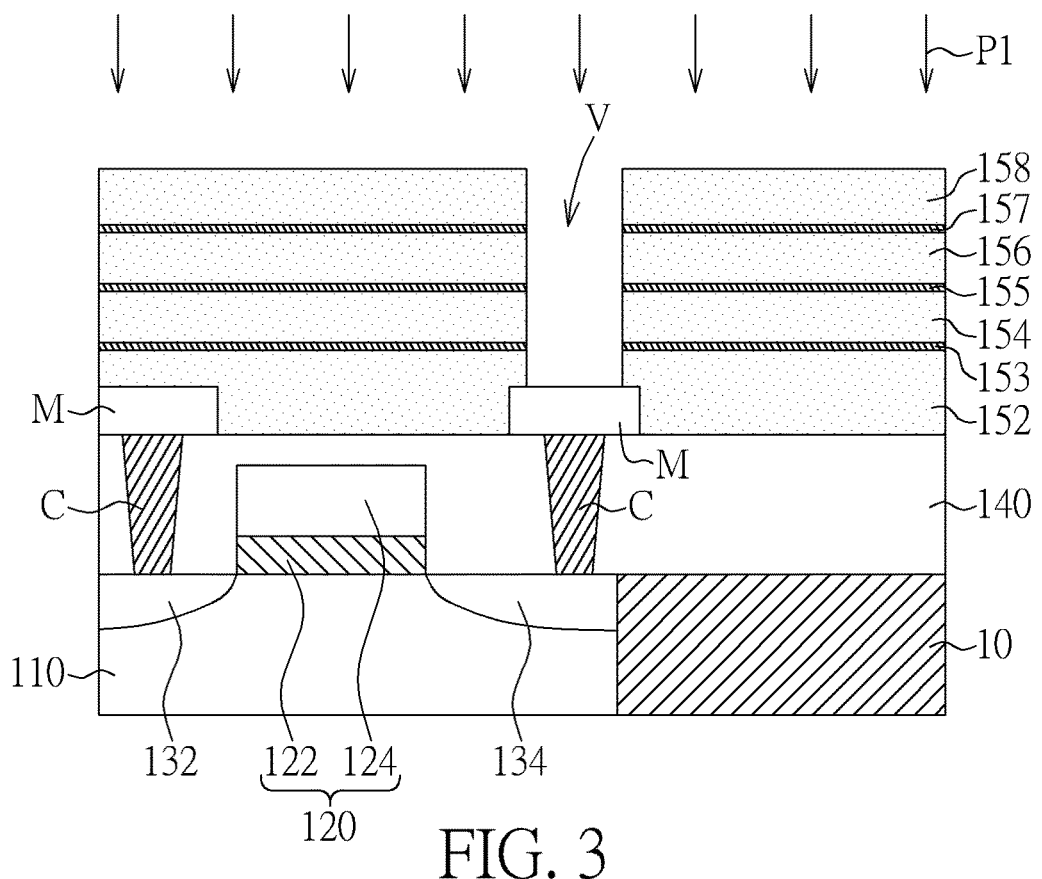
FIG. 3 schematically depicts a cross-sectional view of a method of forming a multi-bit resistive random access memory cell according to an embodiment of the present invention.

After the first etching process P1 of FIG. 3 is performed, a second etching process P2 is performed to etch a sidewall S0 of a through hole V0, thus protruding parts D of the first bottom electrode 153a, the second bottom electrode 155a and the third bottom electrode 157a being exposed. Besides, a resistance layer 162a and a barrier layer 172a conformally cover the protruding parts D and the sidewall S0 of the through hole V0, a top electrode 174a fills the through hole V0. The second etching process P2 may be a wet etching process, but it is not limited thereto. By doing this, a formed multi-bit resistive random access memory cell can save more power than the multi-bit resistive random access memory cell of FIG. 9.

To summarize, the present invention provides a multi-bit resistive random access memory cell and forming method thereof, which sequentially forms a first dielectric layer, a first bottom electrode, a second dielectric layer, a second bottom electrode, a third dielectric layer, a third bottom electrode and a fourth dielectric layer on a layer; performs a first etching process to pattern the fourth dielectric layer, the third bottom electrode, the third dielectric layer, the second bottom electrode, the second dielectric layer, the first bottom electrode and the first dielectric layer to form a through hole in the first dielectric layer, the first bottom electrode, the second dielectric layer, the second bottom electrode, the third dielectric layer, the third bottom electrode and the fourth dielectric layer; and forms a resistance layer conformally covering a sidewall of the through hole and fills a top electrode in the through hole, thereby a multi-bit resistive random access memory cell being carried out.

Moreover, the first bottom electrode is connected to a first contact via, and the first contact via penetrates through the second dielectric layer, the second bottom electrode, the third dielectric layer, the third bottom electrode and the fourth dielectric layer. The second bottom electrode is connected to a second contact via, and the second contact via penetrates through the third dielectric layer, the third bottom electrode and the fourth dielectric layer. The third bottom electrode is connected to a third contact via, and the third contact via penetrates through the fourth dielectric layer. The bottom electrodes serve as word lines while the top electrode serves as a bit line, thereby parts of the resistance layer respectively connecting the bottom electrodes and the top electrode constituting bits of the multi-bit resistive random access memory cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-bit resistive random access memory cell, comprising:

a plurality of bottom electrodes and a plurality of dielectric layers being interleaved layers, each of the bottom electrodes being sandwiched by the dielectric layers, and a through hole penetrating through the interleaved layers;

a top electrode disposed in the through hole; and a resistance layer disposed on a sidewall of the through hole and between the top electrode and the interleaved layers, thereby the top electrode, the resistance layer and the bottom electrodes constituting a multi-bit resistive random access memory cell, wherein protruding parts of the bottom electrodes protrude from the sidewall of the through hole, and the resistance layer conformally covers the sidewall of the through hole and the protruding parts of the bottom electrodes.

2. The multi-bit resistive random access memory cell according to claim 1, wherein the bottom electrodes are connected to contact vias, wherein each of the bottom electrodes is connected to one corresponding contact via, and the contact vias are isolated from each other.

3. The multi-bit resistive random access memory cell according to claim 2, wherein the bottom electrodes serve as word lines while the top electrode serves as a bit line, thereby parts of the resistance layer respectively connecting the bottom electrodes and the top electrode constituting bits of the multi-bit resistive random access memory cell.

4. The multi-bit resistive random access memory cell according to claim 2, wherein the contact vias are disposed in the dielectric layers.

5. The multi-bit resistive random access memory cell according to claim 4, wherein the bottom electrodes and the dielectric layers comprise a first dielectric layer, a first bottom electrode, a second dielectric layer, a second bottom electrode, a third dielectric layer, a third bottom electrode and a fourth dielectric layer stacked from bottom to top.

6. The multi-bit resistive random access memory cell according to claim 5, wherein the first bottom electrode is connected to a first contact via penetrating through the second dielectric layer, the second bottom electrode, the third dielectric layer, the third bottom electrode and the fourth dielectric layer, the second bottom electrode is connected to a second contact via penetrating through the third dielectric layer, the third bottom electrode and the fourth dielectric layer, and the third bottom electrode is connected to a third contact via penetrating through the fourth dielectric layer.

7. The multi-bit resistive random access memory cell according to claim 1, wherein the bottom electrodes comprise titanium nitride (TiN) or tantalum nitride (TaN).

8. The multi-bit resistive random access memory cell according to claim 1, wherein the top electrode comprises copper.

9. The multi-bit resistive random access memory cell according to claim 1, wherein the resistance layer comprises transition metal oxide.

10. The multi-bit resistive random access memory cell according to claim 9, wherein the resistance layer comprises tantalum oxide (TaOx), titanium oxide (TiOx), hafnium oxide (HfOx), zirconium oxide (ZrOx) or aluminum oxide (AlOx).

11. The multi-bit resistive random access memory cell according to claim 1, further comprising:
a transistor disposed on a substrate and in a layer below the bottom electrodes and the dielectric layers, wherein a drain of the transistor is electrically connected to the multi-bit resistive random access memory cell.

* * * * *